(12) United States Patent
Inoguchi

(10) Patent No.: US 7,317,199 B2
(45) Date of Patent: Jan. 8, 2008

(54) CIRCUIT DEVICE

(75) Inventor: Hiroshi Inoguchi, Gunma (JP)

(73) Assignees: Sanyo Electric Co., Ltd., Moriguchi, Osaka (JP); Kanto Sanyo Semiconductor Co., Ltd., Ora-Gun, Gunma (JP)

( * ) Notice: Subject to any disclaimer, the term of this patent is extended or adjusted under 35 U.S.C. 154(b) by 293 days.

(21) Appl. No.: 11/057,932

(22) Filed: Feb. 14, 2005

(65) Prior Publication Data

US 2005/0248009 A1  Nov. 10, 2005

(30) Foreign Application Priority Data

Feb. 18, 2004  (JP) ............................. P2004-040883

(51) Int. Cl.
*H01L 23/02* (2006.01)

(52) U.S. Cl. ............................. 250/680; 257/E33.057; 257/415; 257/417; 257/678; 257/692; 250/214 R; 250/239; 438/106; 438/108; 338/4

(58) Field of Classification Search ........ 257/E25.032, 257/E33.057, 678, 686, 698, 700, 704, 711, 257/415, 417–419, 692, 693, 778, 680; 250/214 R, 250/239, 214.1; 338/4, 42; 438/106, 108
See application file for complete search history.

(56) References Cited

U.S. PATENT DOCUMENTS

| | | | | |
|---|---|---|---|---|
| 4,399,707 A | * | 8/1983 | Wamstad | ..................... 73/727 |
| 4,732,042 A | * | 3/1988 | Adams | ......................... 73/706 |
| 4,843,454 A | * | 6/1989 | Kato et al. | ..................... 73/723 |
| 5,436,492 A | * | 7/1995 | Yamanaka | ................... 257/433 |
| 5,852,320 A | * | 12/1998 | Ichihashi | .................... 257/419 |
| 5,859,759 A | * | 1/1999 | Moriyama et al. | ........ 361/283.4 |
| 6,214,634 B1 | * | 4/2001 | Osajda et al. | .................. 438/50 |
| 6,229,190 B1 | * | 5/2001 | Bryzek et al. | ............... 257/419 |

FOREIGN PATENT DOCUMENTS

| | | |
|---|---|---|
| JP | 11-340257 | 12/1999 |
| JP | 2001-077277 | 3/2001 |
| JP | 2001-156278 | 6/2001 |

\* cited by examiner

*Primary Examiner*—Kenneth Parker
*Assistant Examiner*—Chris C. Chu
(74) *Attorney, Agent, or Firm*—Fish & Richardson P.C.

(57) ABSTRACT

To provide a circuit device suitable for incorporating a semiconductor element emitting or receiving short-wavelength light. The circuit device includes a casing, a semiconductor element, and a cover portion. The casing has an opening on the top face thereof. The semiconductor element is incorporated in the casing and emits or receives light. The cover portion is made of a material transparent to the light and covers the opening. In the periphery of the opening, a concave portion is provided, and a portion of the cover portion with a certain thickness on the bottom side is accommodated in the concave portion. Since the portion of the cover portion with the certain thickness on the bottom side is accommodated in the concave portion provided in the upper portion of the casing, the position of the cover portion is accurately fixed. Accordingly, it is possible to obtain accurate relative positions of the semiconductor element accommodated within the casing and the cover portion.

14 Claims, 10 Drawing Sheets

-- PRIOR ART --

-- PRIOR ART --

CIRCUIT DEVICE

BACKGROUND OF THE INVENTION

Priority is claimed to Japanese Patent Application Number JP2004-040883 filed on Feb. 18, 2004, the disclosure of which is incorporated herein by reference in its entirety.

1. Field of the Invention

The present invention relates to a circuit device of a hollow structure with a semiconductor element housed in a casing thereof.

2. Description of the Related Art

A description is given of a constitution of a conventional circuit device 100 with reference to FIGS. 10A and 10B. FIG. 10A is a plan view of the circuit device 100, and FIG. 10B is a cross-sectional view thereof (see Patent Literature 1).

Referring to FIGS. 10A and 10B, a land 102 made of a conductive material is formed in the center of the circuit device 100, and around the land 102, one end of each of a number of leads 101 is in close vicinity thereof. The one end of each lead 101 is electrically connected to a semiconductor element 104 through a thin metal wire 105, and the other end is exposed from a sealing resin 103. The sealing resin 103 has a function to seal the semiconductor element 104, land 102, and leads 101 and to integrally support the same. In the case of employing an optical element as the semiconductor element 104, light transparent resin is employed as the sealing resin 103.

As the method of sealing the circuit element such as a semiconductor element, there is a method other than resin sealing. An example thereof is a sealing method in which a casing including an internal space is formed of a metal or resin material and the circuit element is incorporated in this internal space. Patent Literature 1: Japanese Patent Laid-Open publication No. 11-340257

However, in the case where an element emitting and receiving short-wavelength light is employed as the aforementioned semiconductor device 104, many problems are caused. Specifically, such problems include a case where short-wavelength light adversely affects the sealing resin 103 and a case where a light signal is degraded by sealing resin. In the former case, when an element emitting and receiving short-wavelength light (for example, blue laser light with a wavelength of about 405 nm) is employed as the semiconductor element 104, color change or the like is caused in the sealing resin 103 by that light. In the latter case, the sealing resin 103 with a release agent and the like mixed therein is not transparent enough, and the short-wavelength light such as blue laser light emitted and received by the semiconductor element 104 is attenuated.

SUMMARY OF THE INVENTION

The present invention was made in the light of the aforementioned problems, and the present invention provides a circuit device suitable for incorporating a semiconductor element emitting or receiving short-wavelength light.

The invention provides a circuit device that includes: a casing including an opening on a top face; a semiconductor element which is incorporated in the casing and emits or receives light; and a cover portion which is made of a material transmitting the light and covers the opening. In the circuit device, a concave portion is provided in the periphery of the opening, and a part of the cover portion with a certain thickness on the bottom side is accommodated in the concave portion.

Furthermore, planar size of the concave portion is larger than that of the cover portion.

Furthermore, the concave portion is tapered from the outside to the inside toward the bottom thereof.

Furthermore, the cover portion is made of glass.

Furthermore, the cover portion is attached to the casing through an adhesive made of resin.

Furthermore, the depth of the concave portion is less than the thickness of the cover portion.

Furthermore, the casing includes a communication portion allowing the inside of the casing to communicate with the outside.

The invention also provides a circuit device that includes: a casing; leads each of which is buried in a bottom portion of the casing and includes portions partially exposed to the inside of the casing; and a plurality of circuit elements incorporated in the casing and electrically connected to the leads. In the circuit device, the circuit elements are electrically connected to each other through the plurality of the exposed portions formed in one of the leads.

Furthermore, in the circuit device of the present invention, the leads are extended inward from the periphery of the casing, and a first exposed portion exposed to the inside of the casing at an end of each of the leads and a second exposed portion exposed to inside of the casing in a middle portion of the lead are provided. Moreover, the circuit elements are electrically connected to each other through the first and second exposed portions.

Furthermore, in the circuit device of the present invention, the circuit elements include a semiconductor element and a capacitor. The semiconductor element and the capacitor are electrically connected to each other through one of the lead.

Furthermore, in the circuit device of the present invention, the circuit elements include an optical semiconductor element emitting or receiving light.

Furthermore, in the circuit device of the present invention, the circuit elements are mounted through a solder material.

Furthermore, in the circuit device of the present invention, each of the leads includes a plurality of portions exposed to the outside of the casing.

The invention further provides a circuit device that includes: a casing; leads each of which is buried in a bottom portion of the casing and partially exposed to the outside of the casing; and a circuit element incorporated in the casing and electrically connected to the leads, in which one of the leads includes a plurality of portions exposed to the outside of the casing.

Furthermore, in the circuit device of the present invention, the exposed portions are connected to the outside through a solder material.

Furthermore, in the circuit device of the present invention, a plurality of the circuit elements are incorporated in the casing, and the leads electrically connected to the plurality of circuit elements form the plurality of exposed portions in the outside of the casing.

The invention provides a circuit device that includes: a casing; a semiconductor element arranged in a bottom portion of the casing; a communication portion which is provided in a portion of the bottom portion corresponding to an arrangement area of the semiconductor element and which allows the inside of the casing to communicate with the outside; and a lead electrically connected to the semiconductor element and exposed to the outside of the casing.

The invention provides a circuit device that includes: a casing which is composed of a bottom portion and a side portion and includes an opening in the upper portion; a semiconductor element which is fixed to the bottom portion and includes one of a light emitting portion and a light receiving portion on a surface thereof; a lead buried in the bottom portion and arranged with one end closer to the semiconductor element; a thin metal wire connecting the semiconductor element and the lead; a cover portion made of a material transparent to either one of the light emitted by the light emitting portion or the light received by the light receiving portion, here, the cover portion covering the opening; and a communication portion which is provided in a portion of the bottom portion corresponding to an arrangement area of the semiconductor element and which allows the inside of the casing to communicate with the outside thereof.

Furthermore, in the circuit device of the present invention, the semiconductor element is fixed to the bottom portion through a die attach sheet.

Furthermore, in the circuit device of the present invention, the communication portion includes: a plurality of groove portions continuously provided to edges of the arrangement area; and a communication hole which is provided through the bottom portion and penetrating the groove portions.

Furthermore, in the circuit device of the present invention, the plurality of groove portions are provided to cross each other, and the communication hole is provided at a place where the groove portions cross each other.

Furthermore, in the circuit device of the present invention, one of the groove portions is provided, and the communication hole is provided in the middle of the groove portion.

Furthermore, in the circuit device of the present invention, the communication portion is formed to protrude from an area where the semiconductor element is placed.

With the circuit device of the present invention, the cover portion transmitting light emitted and received by the semiconductor element is provided in the top face of the casing. Accordingly, this semiconductor can be sealed while the light emitted and received by the semiconductor element is prevented from attenuating. Furthermore, when glass is employed for the cover portion, the aforementioned effect can be enhanced since glass is a material excellent in light transmittance.

Furthermore, the portion of the cover portion with a certain thickness on the bottom side is accommodated in the concave portion provided in the upper portion of the casing, and the position of the cover portion can be accurately fixed. Accordingly, it is possible to obtain accurate relative positions of the semiconductor element accommodated within the casing and the cover portion.

Furthermore, the communication portion allowing the internal space and the outside to communicate with each other is provided. Accordingly, it is possible to prevent the cover portion from being damaged by changes in pressure inside the casing due to temperature variations in use.

With the circuit device of the present invention, the plurality of portions exposed to the inside of the casing are provided for one lead, and the incorporated circuit elements can be electrically connected to each other by this lead. This can simplify a pattern of a mounting board on which the circuit device is to be mounted. Furthermore, according to the present invention, the plurality of portions exposed to the outside of the casing can be formed in one lead, and, therefore, the aforementioned effect can be further enhanced.

Still furthermore, the plurality of portions exposed to the inside of the casing are provided for one lead, and the circuit element is fixed to the exposed portions through the solder material. Accordingly, this solder material can be prevented from unnecessarily spreading.

The circuit device of the present invention includes the communication portion allowing the internal space of the casing and the outside to communicate with each other. This can prevent reduction of reliability due to dew condensation of moisture contained in gas staying in the internal space of the casing. Furthermore, this communication portion is formed in the area where the semiconductor element is arranged. Accordingly, the communication portion can be formed without increasing the size of the entire device.

DETAILED DESCRIPTION OF THE PREFERRED EMBODIMENTS

First Embodiment

Figure 1A:
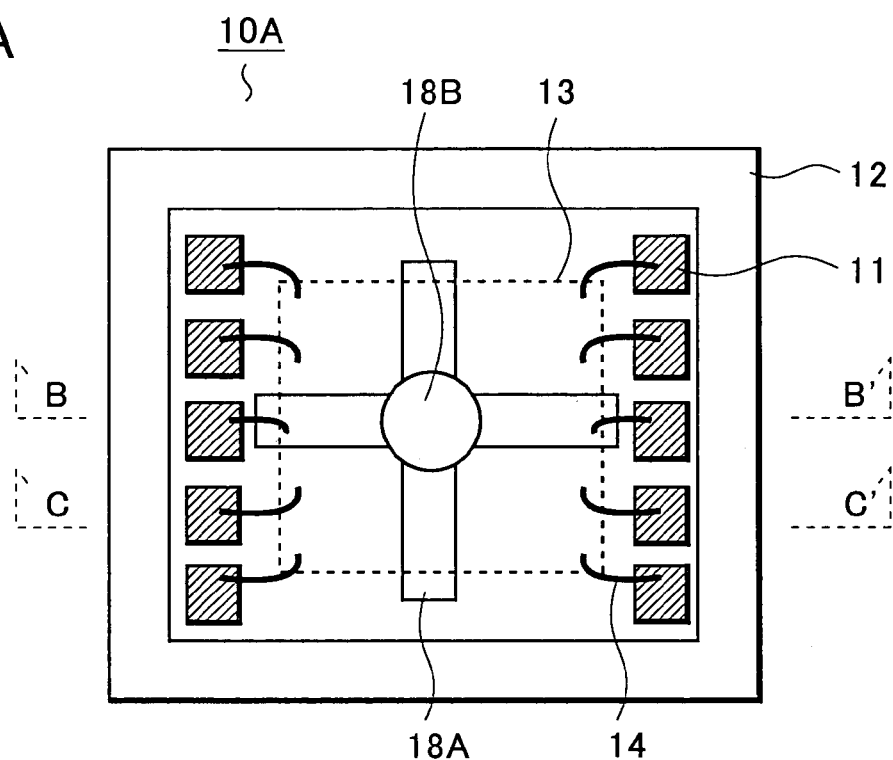
FIGS. 1A to 1C are a plan view, a cross-sectional view, and a cross-sectional view showing a circuit device of the preferred embodiment, respectively.
Figure 1B:
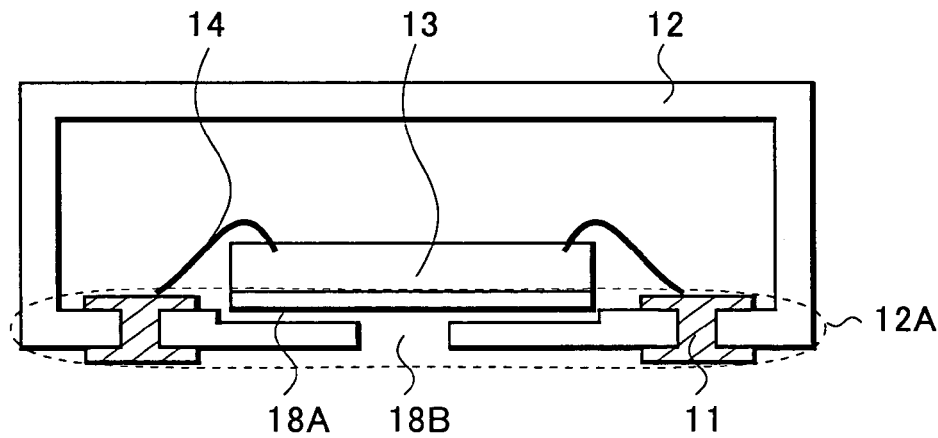
Figure 1C:
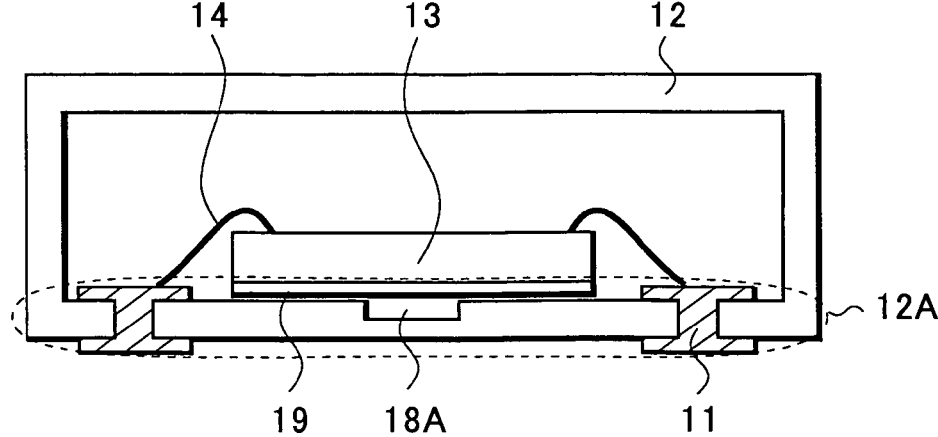

A description is given to a concrete configuration of a circuit device 10A according to an embodiment of the present invention with reference to FIGS. 1A to 1C. FIG. 1A is a plan view of the circuit device 10A, FIG. 1B is a cross-sectional view taken along a line B-B' of FIG. 1A, and FIG. 1C is a cross-sectional view taken along a line C-C' of FIG. 1A.

The circuit device 10A of the preferred embodiment includes a casing 12, a semiconductor element 13, a communication portion, and leads 11. The semiconductor element 13 is arranged in a bottom portion 12A of a casing 12. The communication portion is provided in a portion of the bottom portion 12A corresponding to an area where the semiconductor element 13 is arranged. The communication portion allows the inside of the casing 12 and the outside to communicate with each other. The leads 11 are electrically connected to the semiconductor element 13 and extended to the outside of the casing 12.

The casing 12 has a hollow structure, and the semiconductor element 13 is incorporated in the internal space thereof. As the material of the casing 12, materials made of resin or metals can be generally used. Herein, the semiconductor element 13 is fixed to the bottom portion 12A of the casing 12. The leads 11 electrically connected to the incorporated semiconductor element 13 and extended to the outside are formed in the bottom portion 12A of the casing 12.

The semiconductor element 13 is fixed to the bottom portion 12A of the casing 12 through an adhesive 19. In FIG. 1A, one semiconductor element 13 is shown, but the incorporated element can be generally other passive or active elements. Moreover, the casing 12 can incorporate a plurality of circuit elements. The semiconductor element 13 arranged around the center of the bottom portion 12A is electrically connected to the leads 11 through thin metal wires 14.

Each of the leads 11 forms electrode portions on front and rear faces of the bottom portion 12A. The electrode portions of the leads 11 formed inside the casing 12 are electrically connected to the semiconductor element 13 through the thin metal wires 14. The electrode portions of the leads 11 connected to the outside of the casing 12 function as electrodes for electrical connection with the outside.

The communication portion is an opening allowing the internal space of the casing 12 and the outside to communicate with each other. A description is given of a planar shape of the communication portion with reference to FIG. 1A. Herein, the communication portion is composed of a communication hole 18B and groove portions 18A. The communication hole 18B is a hole provided by partially opening the bottom portion 12A of the casing 12 and provided in an area of the bottom portion 12A where the semiconductor element 13 is placed. The groove portions 18A are grooves provided on the front surface of the bottom portion 12A and form a continuous space with the communication hole 18B. Herein, two cross-shaped groove portions 18A are formed, and the communication hole 18B is formed at a place where the groove portions 18A cross each other.

Furthermore, referring to FIG. 1A, the groove portions 18A are formed so as to protrude from an area (hereinafter, referred to as an arrangement area) where the semiconductor element is arranged. However, the groove portions 18A are not necessarily formed so as to protrude from the arrangement area but should extend to the edge of the arrangement area. In other words, the internal space of the casing 12 and the communication hole 18B should communicate each other by means of the groove portions 18A. The number of the groove portions 18A is arbitrary, and it is possible to provide a single or three or more groove portions 18A. Furthermore, in the drawing, the communication hole 18B is formed in the middle portion of each groove 18A.

The communication hole 18B and groove portions 18A are described in more detail with reference to the cross-sectional view of FIG. 1B. The cross-sectional view of the same drawing shows a cross section at a place where the communication hole 18B is provided. The communication hole 18B penetrating the bottom portion 12A of the casing 12 communicates with the internal space through the groove portions 18A. Specifically, the groove portions 18A formed in the bottom portion 12A and the rear surface of the semiconductor element 13 form a passage which allows the internal space of the casing 12 and the outside to communicate with each other.

The cross sectional view of FIG. 1C shows a cross section of the circuit device 10A at a place where the communication hole 18B is not formed. Referring to the same drawing, the groove portion 18A is formed under the semiconductor element 13. The semiconductor element 13 is fixed to the bottom portion 12A of the casing 12 by the adhesive 19. In the case where an electrical signal passes through the rear surface of the semiconductor element 13, the adhesive 19 is conductive adhesive and is electrically connected to the leads 11. In the case where an electrical signal does not pass through the rear surface, insulating adhesive is used.

The adhesive used for fixing the semiconductor element 13 may be a die attach sheet. This is because use of the adhesive 19 whose viscosity is reduced in a die bonding step could lead the groove portions 18A to be filled with the adhesive 19. In the case of the die attach sheet, the groove portions 18A are not occluded since the die attach sheet is not liquidized in the die bonding step.

Figure 2A:
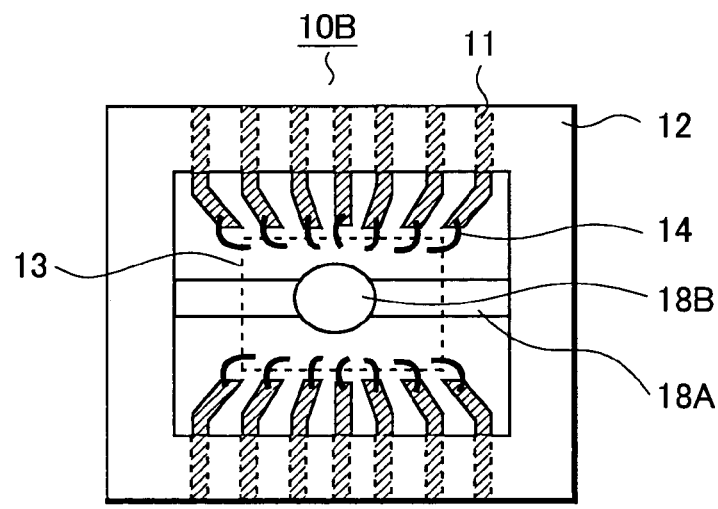
FIGS. 2A to 2D are a plan view, a plan view, a rear view, and a cross-sectional view showing another circuit device of the preferred embodiment, respectively.
Figure 2B:
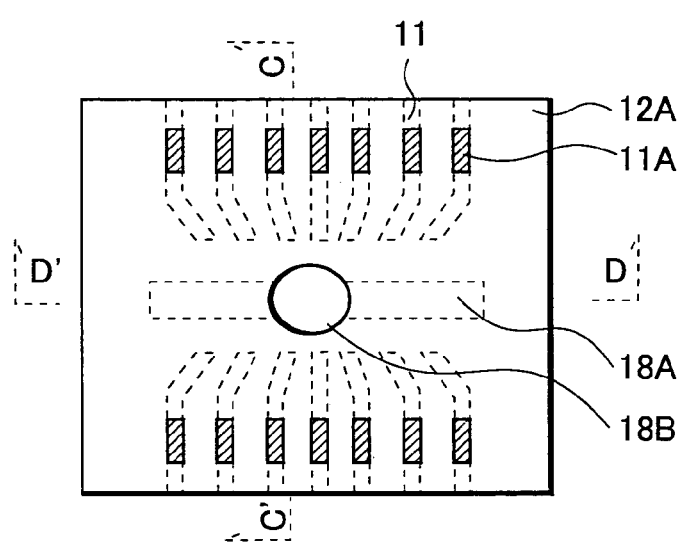
Figure 2C:
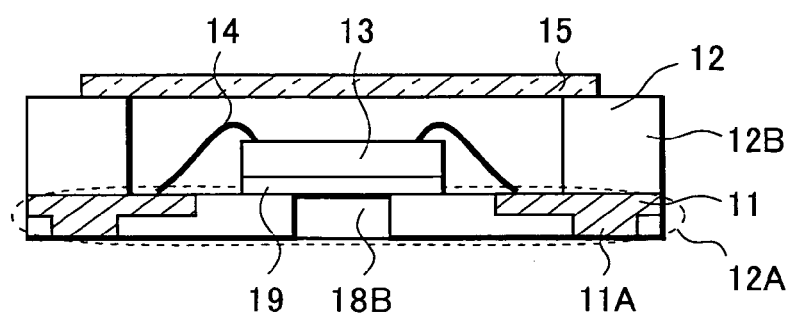
Figure 2D:
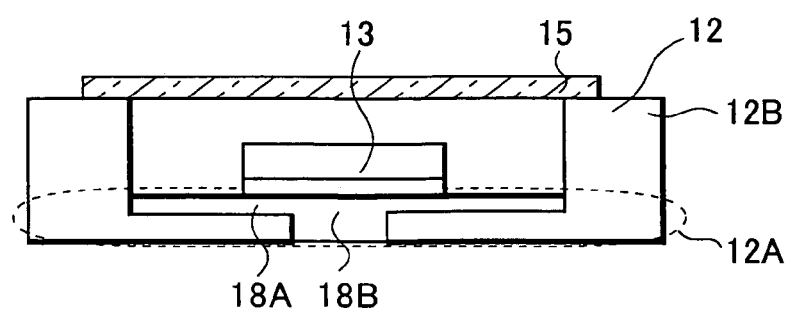

The following description is given of a circuit device 10B of another embodiment with reference to FIGS. 2A to 2D. FIG. 2A is a top view of the circuit device 10B; FIG. 2B is a bottom view of the same; FIG. 2C is a cross-sectional view taken along a line C-C' of FIG. 2B; and FIG. 2D is a cross-sectional view taken along a line D-D' of FIG. 2B.

Referring to FIGS. 2A to 2D, the circuit device 10B includes the casing 12, the semiconductor element 13, the leads 11, the thin metal wires 14, cover portion 15, and the communication portion. The casing 12 is composed of the bottom portion 12A and the side portion 12B and includes an opening in the upper portion thereof. The semiconductor element 13 is fixed to the bottom portion 12A and includes a light receiving portion or a light emitting portion on the front surface thereof. The leads 11 are buried in the bottom portion 12A and arranged such that one end of each lead 11 is in close vicinity of the semiconductor element 13. The thin metal wires 14 connect the semiconductor element 13 and the leads 11. The cover portion 15 is made of a material transparent either to the light received by the light receiving portion or the light emitted by the light emitting portion and covers the opening. The communication portion is provided in a portion of the bottom portion 12A corresponding to the arrangement area of the semiconductor element 13 and allows the inside of the casing 12 and the outside to communicate to each other.

As described above, the basic structure of the circuit device 10B is similar to that of the circuit device 10A explained with reference to FIGS. 1A to 1C, and the circuit devices 10B and 10A are different from each other in the structure of the casing 12 and the like. The differences are mainly described.

The casing 12 is made of resin. In the casing 12, a space accommodating the semiconductor element 13 is formed inside, and an opening is provided in the upper portion thereof. The casing 12 is composed of the bottom portion 12A constituting the bottom of a case and the side portion 12B extending upward from four sides of the periphery of the bottom portion 12A.

Referring to FIG. 2A, one end of each of the leads 11 extends close to the semiconductor element 13, and the other end extends to the periphery of the circuit device 10. Intervals between the leads 11 near the semiconductor element 13 are smaller than intervals between the leads 11 in the periphery. Furthermore, a plurality of the leads 11 extend so as to sandwich the semiconductor element 13 on both sides. The leads 11 may extend in four directions so as to surround the semiconductor element 13.

A description is given of a cross-sectional structure of the leads 11 with reference to FIG. 2C. Each of the leads 11 includes a protrusion portion 11A protruding downward in the periphery of the circuit device 10B. The ends of the leads 11 which are farther from the semiconductor element 13 (which are in the periphery) are exposed to the outside from the side portion 12B of the casing 12. The rear surfaces of the protrusion portions 11A are exposed on the rear side of the bottom portion 12A, which is shown in FIG. 2B. The rear surfaces of the protrusion portions 11B exposed to the outside function as external electrodes for electrical connection with the outside through a solder material such as soft solder. Accordingly, the intervals between the protrusion portions 11A are determined in a range where solder bridging is not caused.

Furthermore, in this embodiment, as the material of the leads 11, alloy 42 is employed. The alloy 42 is an alloy containing 42% of nickel and 58% of iron. The coefficient of linear expansion of this alloy 42 is about 7 ppm, which is approximate to that of glass. Furthermore, the coefficient of linear expansion of the resin constituting the casing can be set to about 7 ppm by regulating the constituents thereof. Accordingly, the coefficients of linear expansion of the components constituting the circuit device 10B can be approximate to each other, thus increasing reliability in temperature variation.

The semiconductor element 13 is accommodated within the casing 12 and fixed to the front surface of the bottom portion 12A. Electrodes of the semiconductor element 13 and the leads 11 are electrically connected through the thin metal wires 14. For the semiconductor element 13, a light receiving element and/or a light emitting element is formed on the front surface thereof. Herein, the semiconductor element 13 can be an element receiving and emitting high-frequency blue laser light with a wavelength of about 405 nm.

The cover portion 15 has a function to cover the opening of the casing 12 from above, and the material thereof is a material transparent to the light emitted and received by the semiconductor element 13. For example, when the semiconductor element 13 emits and receives high-frequency blue laser light with a wavelength of about 405 nm, a material transparent to this blue laser light is employed for the cover portion 15. As an example thereof, glass is suitable for the cover portion 15. The cover portion 15 is attached to the casing 12 through an insulating adhesive. Furthermore, the entire device can be constituted without the cover portion 15. Glass which is the material of the cover portion 15 is very expensive, and the constitution without glass can reduce the entire manufacturing cost.

The communication portion allowing the inside of the casing 12 and the outside to communicate with each other is described. Referring to FIG. 2A, herein, the communication hole 18B is formed in substantially the center of the area where the semiconductor element 13 is placed, and the groove portion 18A continuous with the communication hole 18A is formed. In the description using FIG. 1, the plurality of groove portions 18A are formed in the bottom portion 12A, but herein, one groove portion 18A is formed. Providing one groove portion 18A in such a manner can reduce an area occupied by the groove portion 18A, thus increasing the degree of freedom in designing the leads 11. More specifically, the direction that the groove portion 18A extends is parallel to the direction where the leads 11 are aligned. The groove portion 18A with a cross-sectional shape other than a rectangle also has no problem and can employ a U-shaped or V-shaped cross-section.

Referring to FIG. 2C, the semiconductor element 13 is fixed to the bottom portion 12A through the adhesive 19. As described above, the adhesive 19 may be a die attach sheet. Using the die attach sheet can prevent the communication hole from being occluded.

Referring to FIG. 2D, the internal space of the casing 12 is continuous with the outside through the communication hole 18B and groove portion 18A. When the internal space and the outside are continuous through the groove portion 18A, compared to the case where the internal space and the outside are continuous through only a through-hole, the path through which the internal space and the outside communicate each other can be lengthened. Accordingly, this long path can prevent dust from entering the casing 12 from the outside.

A description is given to another merit by the communication portion. When the internal space is designed to communicate with the outside by the communication portion, the inside of the casing 12 can have the same pressure as pressure of the outside. The circuit device 10 is surface-mounted on a mounting board or the like by a reflow step carried out with soft solder or the like. At this time, the atmosphere around the circuit device 10 reaches about 200 degree. In the case where the internal space of the casing 12 is sealed, the internal space of the casing 12 reaches extremely high pressure in this reflow step, which could cause breaks and the like in the entire device. In this embodiment, the internal space of the casing 12 is designed to communicate with the outside to prevent the internal pressure from rising when the device is heated at high temperature. It is therefore possible to increase the reliability in temperature variation.

Second Embodiment

Figure 3A:
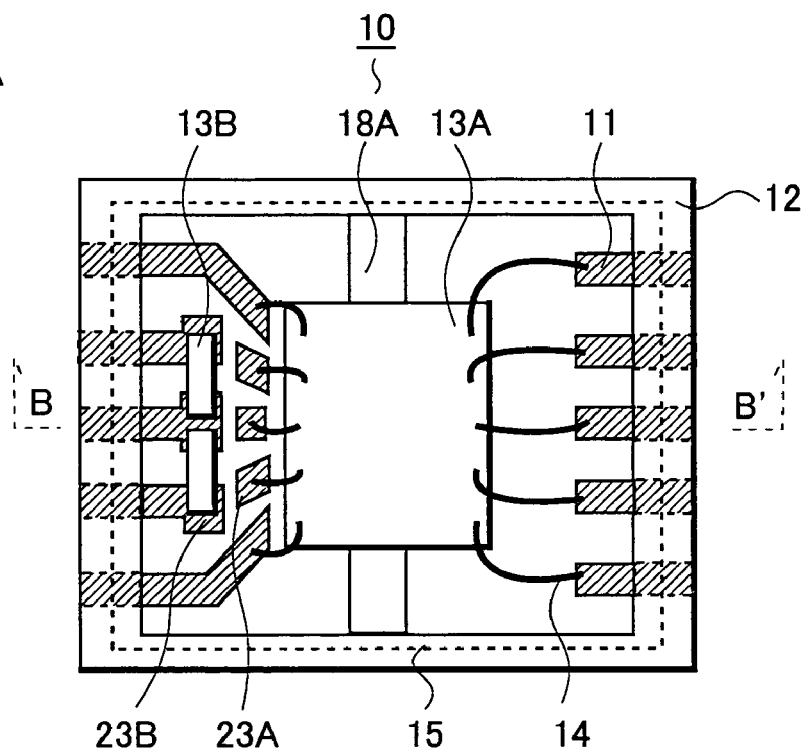
FIGS. 3A to 3C are a plan view, a cross-sectional view, and a cross-sectional view showing another circuit device of the preferred embodiment, respectively.
Figure 3B:
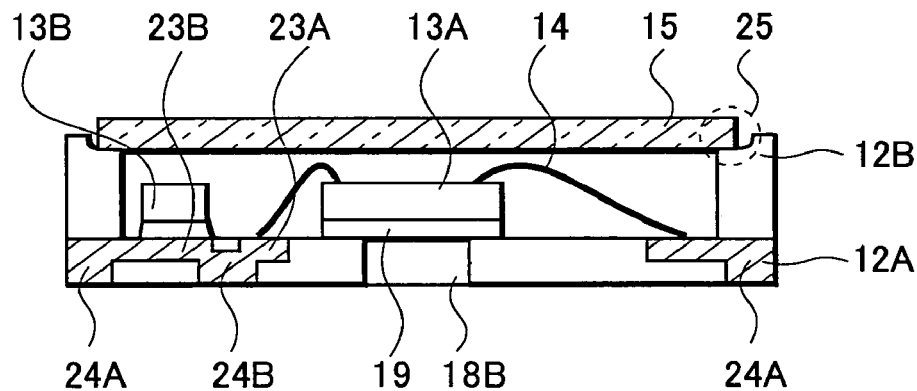
Figure 3C:
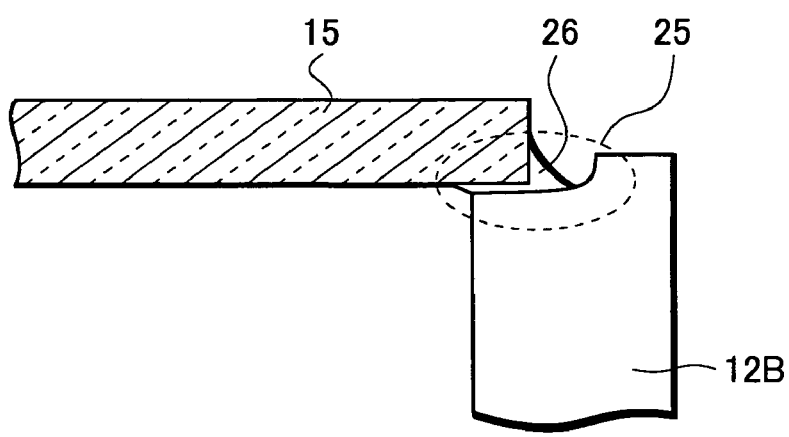

A concrete configuration of a circuit device 10 according to an embodiment of the present invention is described with reference to FIGS. 3A to 3C. FIG. 3A is a plan view of the circuit device 10, FIG. 3B is a cross-sectional view taken along a line B-B' of FIG. 3A, and FIG. 3C is an enlarged cross-sectional view around the concave portion 25.

The circuit device 10 of this embodiment includes a casing 12, a semiconductor element 13A, and a cover portion 15. The casing 12 has an opening in the top face. The semiconductor element 13A is incorporated in the casing 12 and emits or receives light. The cover portion 15 is made of a material transmitting light and covers the opening. A concave portion 25 is provided in the periphery of the opening portion and is configured to accommodate a portion of the cover portion 15 with a certain thickness on the bottom side. The structure of the thus structured circuit device 10 is described in detail below.

The casing 12 includes a hollow structure, and the semiconductor element 13A is incorporated in the internal space thereof. As the material of the casing 12, materials made of resin or metals can be generally used. Herein, the semiconductor element 13A is fixed to a bottom portion 12A of the casing 12. Leads 11 electrically connected to the incorporated semiconductor element 13A and extended to the outside are buried in the bottom portion 12A of the casing 12. Furthermore, the material of the casing 12 may be a material with low wettability to a solder material such as soft solder. This is because spread of the solder material for fixing a chip element 13B can be limited.

A circuit element 13 is an element incorporated in the casing 12, and the semiconductor element 13A and chip elements 13B are incorporated in the casing 12. The semiconductor element 13A is fixed to the bottom portion 12A of the casing 12 through the adhesive 19. Furthermore, the semiconductor element 13A is electrically connected to the leads 11 through thin metal wires 14. The chip elements 13B are chip-type circuit elements such as chip capacitors and chip resistors. The chip elements 13B are fixed to the leads 11 through a solder material such as soft solder.

The semiconductor element 13A is incorporated in the casing 12 and fixed to the front surface of the bottom portion 12A. The electrodes of the semiconductor element 13A and the leads 11 are electrically connected through the thin metal wires 14. The semiconductor element 13A includes a light receiving element and/or a light emitting element formed on the surface thereof. Herein, the semiconductor element 13A can be an element emitting and receiving high frequency blue laser light with a wavelength of about 405 nm.

Referring to FIG. 3B, the cover portion 15 is provided so as to cover the opening provided in the top face of the casing 12B. The cover portion 15 has a function to cover the opening of the casing 12 from above, and the material thereof is a material transparent to the light emitted and received by the semiconductor element 13A. For example, when the semiconductor element 13 emits and receives high-frequency blue laser light with a wavelength of about 405 nm, a material transparent to this blue laser light is employed for the cover portion 15. As an example thereof, glass is suitable for the cover portion 15. The cover portion 15 is attached to the casing 12 through insulating adhesive. The cover portion 15 with a certain thickness on the bottom side is received by the concave portion 25 provided in the periphery of the opening.

Furthermore, the entire device can be constituted without the cover portion 15. Glass which is the material of the cover portion 15 is very expensive, and constituting the device without glass can reduce the entire manufacturing cost.

The concave portion 25 is an area which corresponds to the area where the cover portion 15 is placed and which is uniformly recessed in the upper face of the casing 12. The planar size of the concave portion 25 is designed to be larger than that of the cover portion 15. Furthermore, the depth of the concave portion 25 is designed to be less than the thickness of the cover portion 15. As an example, when the thickness of the cover portion 15 is about 300 µm, the depth of the concave portion 25 is about 100 µm. The concave portion 25 provided in this manner can further strengthen the contact between the cover portion 15 and the casing 12.

The concave portion 25 is described in more detail with reference to FIG. 3C. This drawing is an enlarged cross-sectional view of a part of the circuit device 10 around the concave portion 25. A portion of the cover portion 15 with a certain thickness on the bottom side is accommodated in the concave portion 25, and the position thereof is restricted. The cross-sectional shape of the concave portion 25 is tapered from the outside to the inside toward the bottom thereof. This can further enhance the effect on restricting the position of the cover portion 15. The cover portion 15 is attached to the concave portion 25 of the casing 12 through an adhesive 26. The adhesive 26 can be a resin-type adhesive such as epoxy resin.

The leads 11 form exposed portions in the front and rear surfaces of the bottom portion 12A. Portions (pads 23A and 23B) of each lead 11 exposed to the inside of the casing 12 are electrically connected to the circuit elements 13A and 13B incorporated. Portions (terminal portions 24A and 24B) of each lead 11 exposed to the outside of the casing 12 function as electrodes for electrical connection with the outside.

The leads 11 are further described in detail with reference to FIG. 3A. The leads 11 are extended from the periphery of the circuit device 10 to the vicinity of the semiconductor element 13A. To be more specific, the plurality of leads 11 are arranged so as to sandwich the semiconductor element 13A positioned in the center, or arranged on right and left sides of the semiconductor element 13A in the drawing. Herein, the second pads 23B are formed in the leads 11 arranged on one side. However, the second pads 23B may be formed in the leads 11 arranged on the both right and left sides of the semiconductor element 13A.

Some of the leads 11 arranged on the left side of the semiconductor element 13A form bonding pads and also form die pads to which the chip elements 13B are fixed. These pads are composed of surfaces of the leads 11 exposed to the internal space of the casing 12. Specifically, these pads, in other words the first pad 23A connected to the thin metal wire 14 and the second pad 23B on which each chip element 13B is fixed, are formed in each of three leads 11 arranged in the center among the leads 11 arranged on the left side of the semiconductor element 13A. These two pads are composed of portions of one lead 11 and, therefore, electrically connected to each other.

The first pad 23A is composed of an end portion of each lead 11 exposed to the internal space of the casing 12 and functions as a pad for wire bonding. The first pad 23A is exposed from the bottom portion 12A of the casing 12 so as to be isolated from the second pad 23B. The casing 12 including the bottom portion 12A is made of resin with low wettability to soft solder. Accordingly, when the second pad 23B is designed to be isolated and exposed from the bottom portion 12A, it is possible to prevent a solder material applied on the second pad 23B from adhering to the first pad 23A. In other words, between the first and second pads 23A and 23B, the resin constituting the bottom portion 12A is interposed.

The second pad 23B is composed of a middle portion of each lead 11 and exposed to the inside of the casing 12. In this embodiment, the second pad 23B functions as a pad on which the chip element 13B is fixed through a solder material such as soft solder. Herein, in the middle of each of the three leads 11, the second pad 23B is formed.

Referring to FIG. 3A, two chip elements 13B are fixed through soft solder across the respective second pads 23B. Furthermore, the portion of each lead 11 to which the chip element 13B is fixed is formed so as to have a larger width than the other portions. This can secure the connection of the chip element 13B through soft solder.

The cross-sectional shape of the leads 11 is further described. Each of the terminal portions 24A and 24B is formed of apart of each lead 11 partially exposed from the bottom portion 12A to the outside. In this embodiment, two terminal portions composed of the first and second terminal portions 24A and 24B are formed. The first terminal portion 24A is provided in the periphery of the circuit device 10. The first terminal portion 24A functions as an external electrode which is to be attached to the outside through a solder material such as soft solder. The second terminal portion 24B is composed of a middle portion of the lead 11 exposed to the outside. Specifically, the two-dimensional position of the second terminal portion 24B is in the middle between the first and second pads 23A and 23B. The second terminal portion 24B can be also used as an external terminal. Furthermore, the first and second terminal portions 24A and 24B are separated from each other by resin filled therebetween. Accordingly, the solder material applied to the second terminal portion 24B can be prevented from coming into contact with the first terminal portion 24A. As described above, when the single lead 11 is designed to include the plurality of external terminals, a same electrical signal can be taken out at a plurality of different points. In addition, it is possible to increase the degree of freedom in wiring on the mounting board on which the circuit device 10 is mounted.

As described above, each of the chip elements 13B and the semiconductor element 13A are electrically connected through one lead 11. This embodiment has a merit in that the distance between each chip element 13B and the semiconductor element 13A can be minimized. For example, when the chip element 13B is a capacitor for noise reduction, the short distance from the semiconductor element can enhance the noise reduction effect.

Figure 4A:
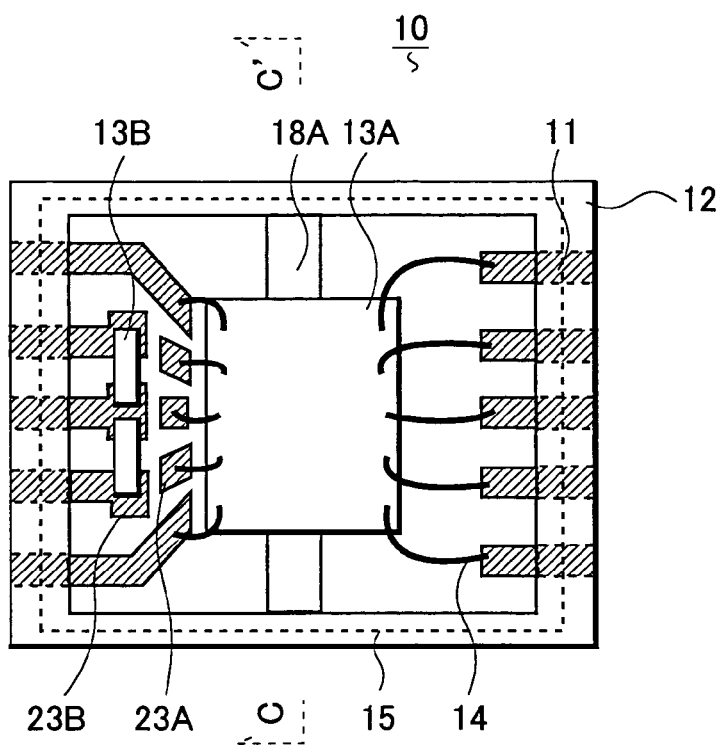
FIGS. 4A to 4C are a plan view, a rear view, and a cross-sectional view showing the circuit device of the preferred embodiment, respectively.

Other components of the circuit device 10 are described with reference to FIGS. 4A to 4C. FIG. 4A is a plan view of the circuit device 10 of this embodiment, FIG. 4B is a rear view thereof, and FIG. 4C is a cross-sectional view taken along a line C-C' of FIG. 4A.

Figure 4B:
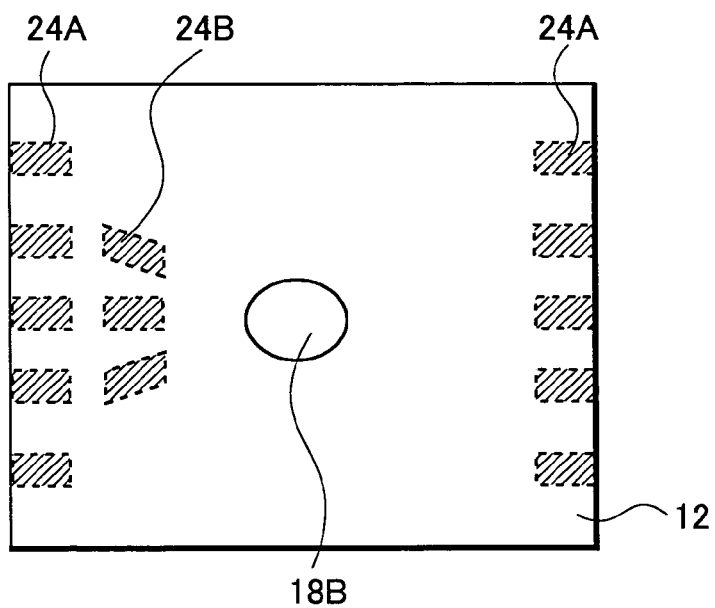
Figure 4C:
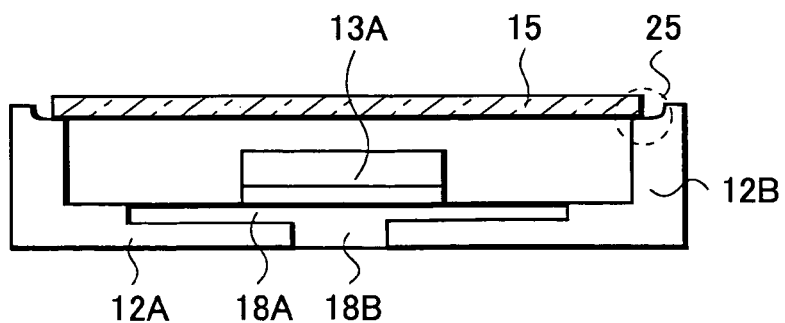

Referring to FIG. 4B, the first terminal portions 24A are formed in the periphery of the rear face of the circuit device 10. Herein, the plurality of first terminal portions 24A is formed along opposite sides. The first terminal portions 24A are arranged so as to be spaced from each other by a predetermined distance. The second terminal portions 24B are spaced from the periphery of the casing 12 and exposed in the rear face thereof. The second terminals 24B are electrically connected to the respective first terminal portions 24A horizontally adjacent thereto in the drawing. The terminals 24A and 24B are spaced from each other enough to cause no solder bridges.

Figure 5:
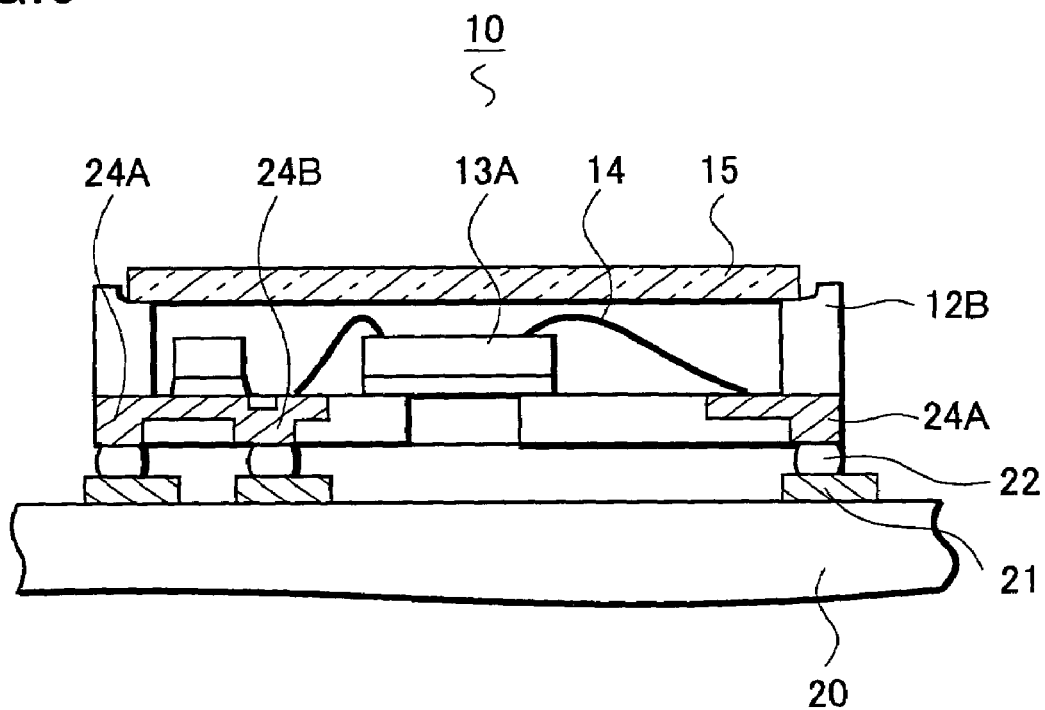
FIG. 5 is a cross-sectional view showing the circuit device of the preferred embodiment.

The mounting structure of the circuit device 10 of the aforementioned constitution is described with reference to a cross-sectional view of FIG. 5. Referring to the cross-sectional view of FIG. 5, the circuit device 10 is fixed to conductive paths 21 on a mounting board 20 by applying a solder material 22 such as soft solder to the terminal portions 24A and 24B exposed in the rear face of the circuit device 10. In other words, the shape and position of the solder material 22 are restricted by using the wettability of the exposed portions of the leads 11 made of metal such as copper to reduce the risk of short circuit due to solder bridges. Herein, with the first terminal portions 24A, the second terminal 24B are also fixed to the conductive paths 21 using the solder material 22. However, if the second terminal portions 24B are not necessary to come into contact with the outside, the circuit device 10 can be mounted while the solder material is not applied to the second terminal portions 24B.

A method of manufacturing the aforementioned circuit device 10 is described with reference to FIG. 6A to FIG. 6B.

Figure 6A:
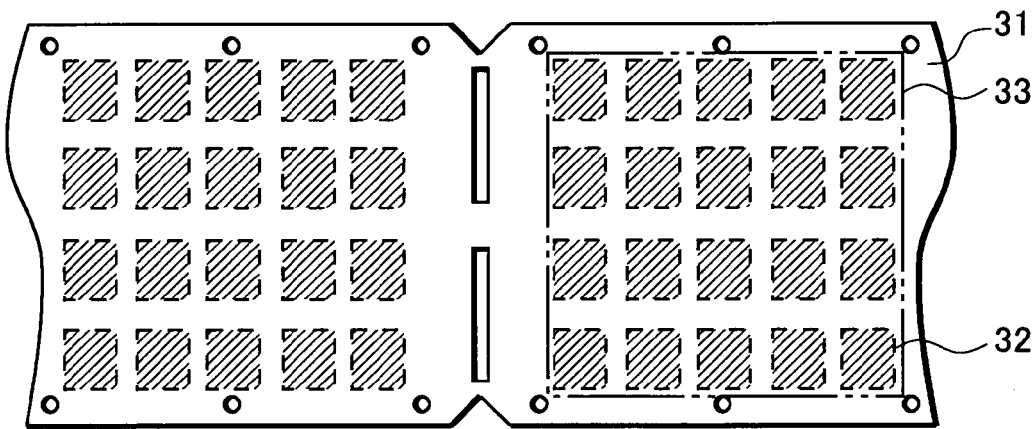
FIGS. 6A to 6C are a plan view, a plan view, and a cross-sectional view showing a method of manufacturing the circuit device of the preferred embodiment, respectively.
Figure 6B:
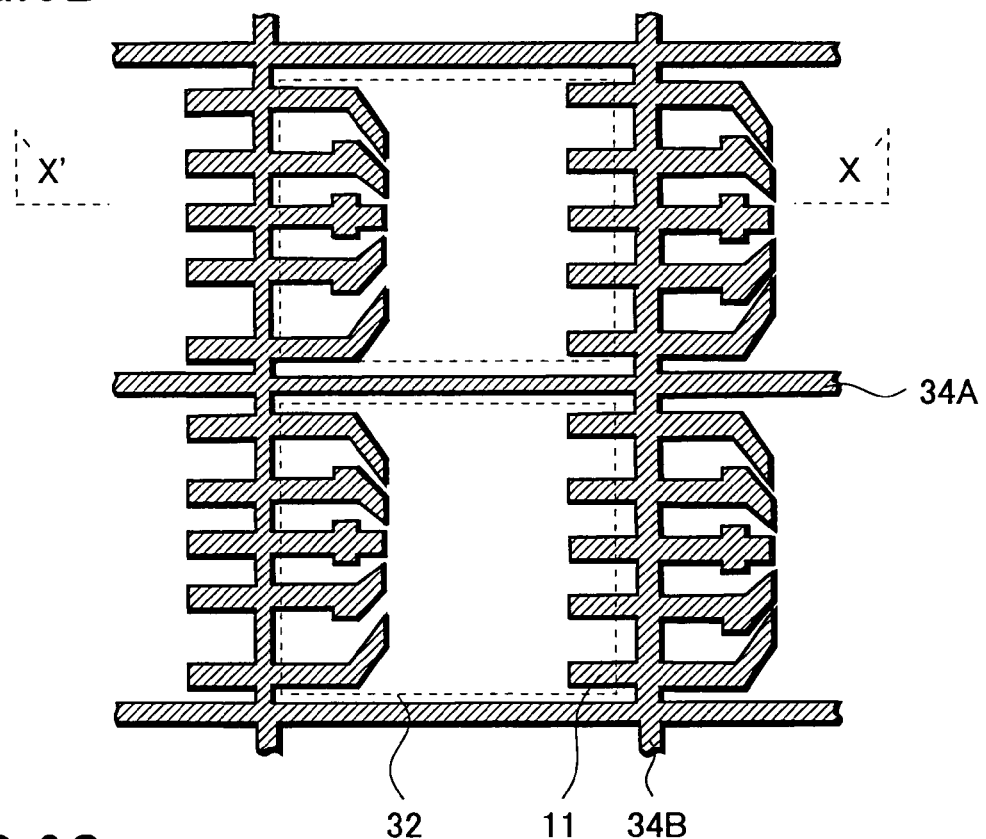
Figure 6C:
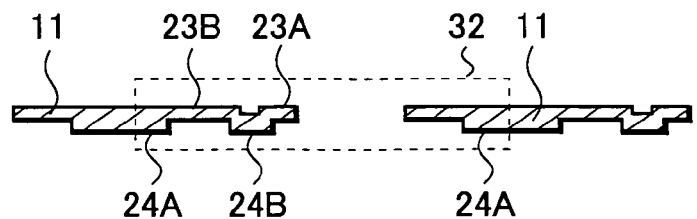

First, referring to FIGS. 6A to 6C, units 32, each including a plurality of the leads 11, are formed. FIG. 6A is a plan view of a frame 31 including a plurality of blocks 33 formed thereon, FIG. 6B is an enlarged view of the units 32 of one block 33, and FIG. 6C is a cross-sectional view taken along a line X-X' of FIG. 6B.

Referring to FIG. 6A, the plate-shaped frame 31 made of metal such as copper is processed to arrange a plurality of blocks 33 with a predetermined distance therebetween in the frame 31. In each of the blocks 33, a number of units 32 are formed in a matrix. Herein, the "unit" is an element unit constituting one circuit device. The material of the frame 31 may be alloy 42.

The concrete constitution of the aforementioned units 32 is described with reference FIG. 6B. In this embodiment, first joint portions 34A and second joint portions 34B are extended at a regular interval in each block 33. Herein, the first joint portions 34A are extended in the horizontal direction in the page at a regular interval, and the second joint portions 34B are extended at a regular interval so as to cross with the first joint portions 34A at right angles. Herein, the leads 11 are extended right and left from the second joint portions 34B extending in the vertical direction.

A description is given of a cross section of the lead 11 formed on the left side within the unit 32 with reference to FIG. 6C. In a place of the lead 11 corresponding to the periphery of the unit 32, the first terminal portion 24A protruding downward is formed. Furthermore, in a place of the lead 11 corresponding to the second terminal portion 24B, a portion protruding downward is formed. In the upper portion of the lead 11, protruded areas corresponding to the first and second pads 23A and 23B are formed to protrude upward.

The leads 11 formed on the right area within the unit 32 are described. In the cross-section of the leads 11 in this area, an area protruding downward is formed so that the first terminal portion 24A is formed in the bottom. The length of the leads 11 in this area is shorter than the leads 11 on the left side in which the second terminal portions 24B are formed. The aforementioned processing of the frame 31 is performed by pressing or etching.

Figure 7A:
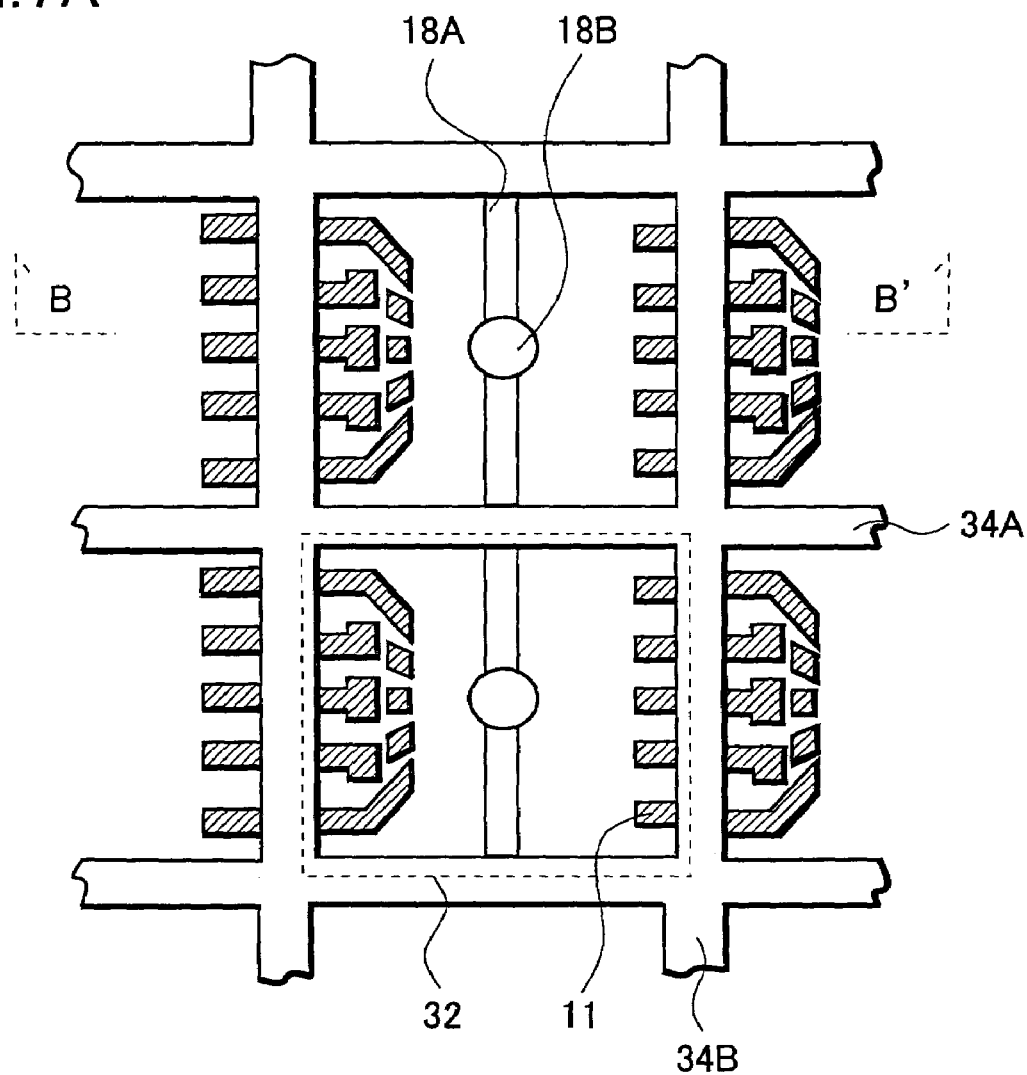
FIGS. 7A and 7B are a plan view and a cross-sectional view showing a method of manufacturing the circuit device of the preferred embodiment, respectively.
Figure 7B:
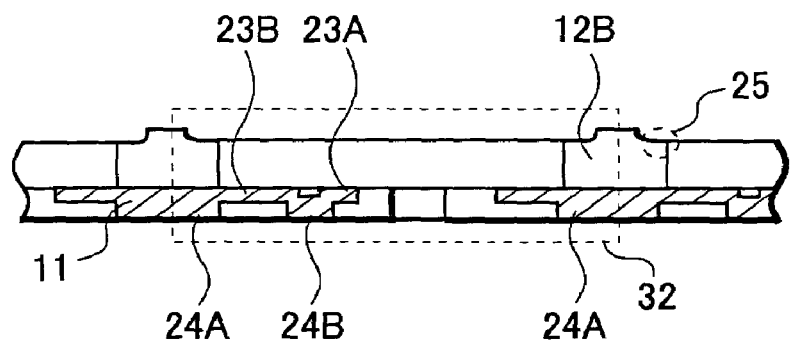

Next, referring to FIGS. 7A and 7B, the bottom portion 12A made of resin is formed such that the leads 11 are buried therein while the surfaces of the leads 11 in the places to be electrical connection areas are exposed, and the side portion 12B continuous from the bottom portion 12A is formed, thus the casing 12 having an opening for each unit 32 is formed by injection-molding. FIG. 7A is an enlarged view of the units 32, and FIG. 7B is a cross-sectional view taken along a line B-B' of FIG. 7A.

Herein, each block 33 is accommodated in a cavity, and all units 32 in the block 33 are collectively subjected to resin sealing. This resin sealing can be performed by injection molding using thermoplastic resin or transfer molding using thermosetting resin. To form the area accommodating the semiconductor element 13A, an upper mold used in this step has a shape corresponding to a shape of the internal space of the casing 12. Specifically, in the upper mold for molding, a protruded portion having a shape fitting to the internal space of the casing 12 is formed. In resin sealing, the front surfaces of the leads 11 abut on the bottom surface of the upper mold. This can prevent sealing resin from accidentally adhering to the electrical connection areas in the front surfaces of the leads 11. Furthermore, when resin burrs adhere to the upper surfaces of the leads 11 the burrs are removed by high-pressure washing or the like.

Referring to FIG. 7B, the concave portion 25 is formed in the upper face of the side portion 12B. The concave portion 25 is formed by forming a shape corresponding to the concave portion 25 in the upper mold for molding. This concave portion 25 is formed in each unit 32.

Furthermore, in the aforementioned step, the rear surfaces of the second terminal portions 24B abut on the bottom surface of a lower mold for molding. This can prevent the front surfaces of the first pads 23A from being separated from the upper mold. It is, therefore, possible to prevent resin from adhering to the front surfaces of the first pads 23A in the molding step.

Figure 8A:
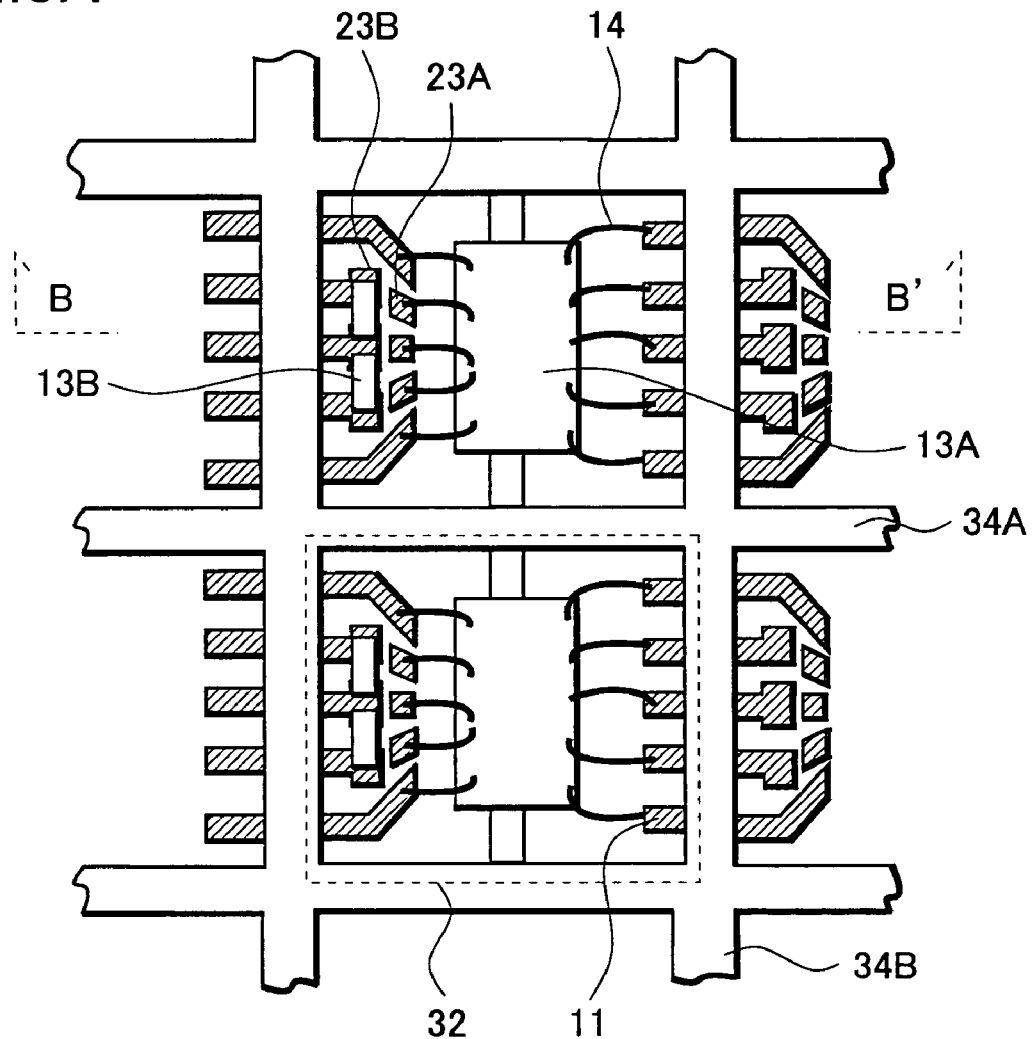
FIGS. 8A and 8B are a plan view and a cross-sectional view showing the method of manufacturing the circuit device of the preferred embodiment, respectively.
Figure 8B:
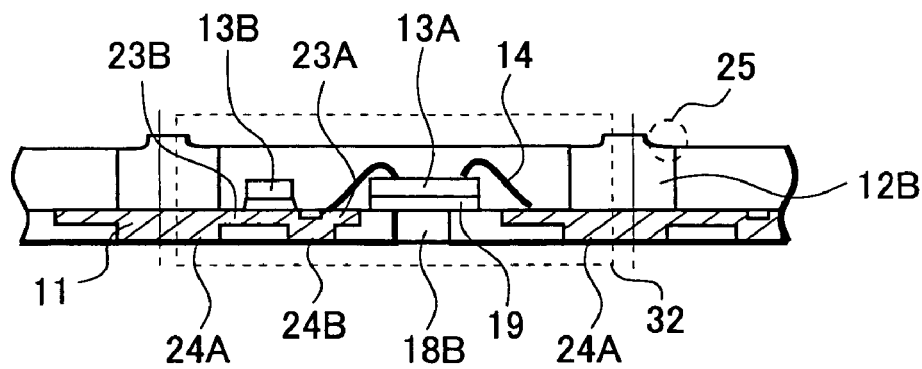

Referring to FIGS. 8A and 8B, next, the semiconductor element 13A and the like are mounted on each unit 32. FIG. 8A is an enlarged view of the units 32, and FIG. 8B is a cross-sectional view taken along a line B-B' of FIG. 8A.

Referring to FIGS. 8A and 8B, the semiconductor element 13A is arranged around the center of each unit 32 and electrically connected to the first pads 23A through the thin metal wires 14. Furthermore, the chip elements 13B are fixed to the second pads 23B through the solder material. As described above, the first and second pads 23A and 23B are independently exposed. Accordingly, it is possible to prevent the solder material applied on the front surfaces of the second pads 23B from coming into contact with the first pads 23A.

Referring to FIG. 8B, the semiconductor element 13A is fixed to the bottom portion of each unit 32 through the adhesive 19. Herein, the adhesive 19 may not be liquidized in fixing by die-bonding. If an adhesive liquidized in die-bonding is used, the communication hole 18B could be filled with the liquidized adhesive. In this embodiment, the die attach sheet is, therefore, employed as the adhesive 19. The die attach sheet is a film-shaped adhesive and is not liquidized when heated in die-bonding. Moreover, it is possible to use adhesives other than the die attach sheet if the adhesives are not liquidized under the temperature situation of die bonding. Herein, the semiconductor element 13 can be a semiconductor element with a section emitting or receiving light.

Figure 9A:
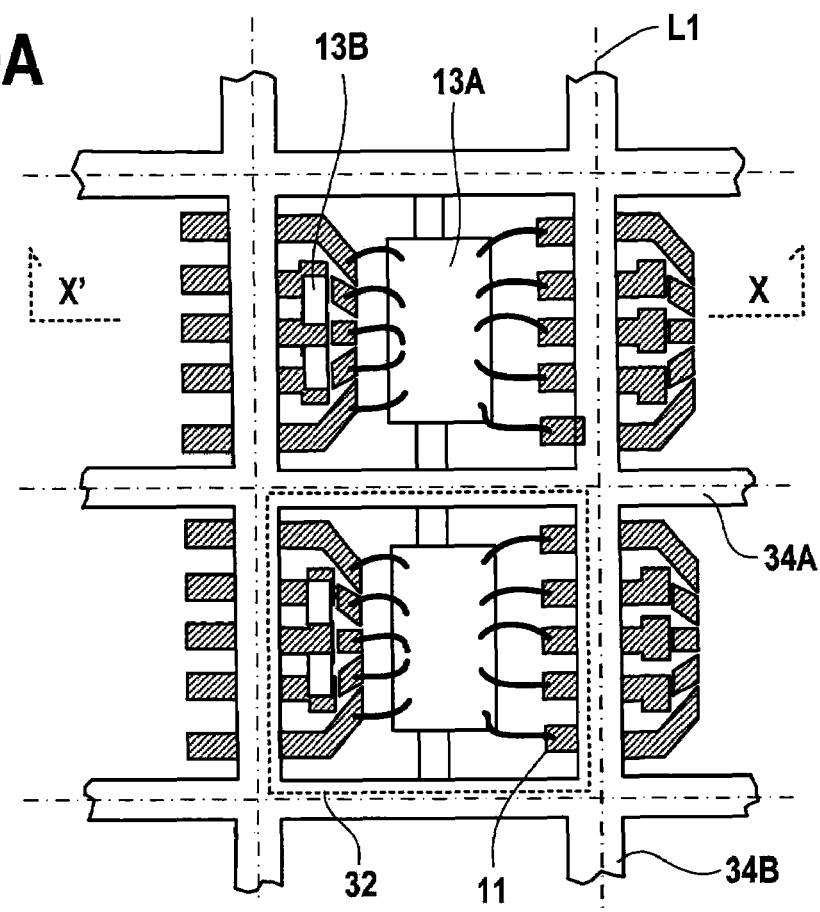
FIGS. 9A and 9B are a plan view and a cross-sectional view showing the method of manufacturing the circuit device of the preferred embodiment, respectively.
Figure 9B:
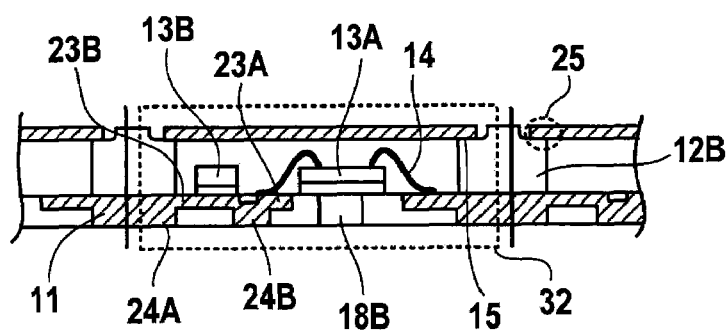
Figure 10A:
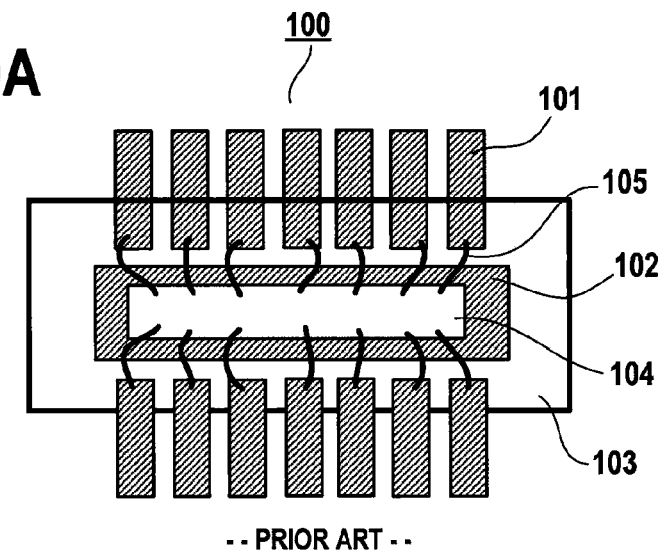
FIGS. 10A and 10B are a plan view and a cross-sectional view showing a conventional circuit device.
Figure 10B:
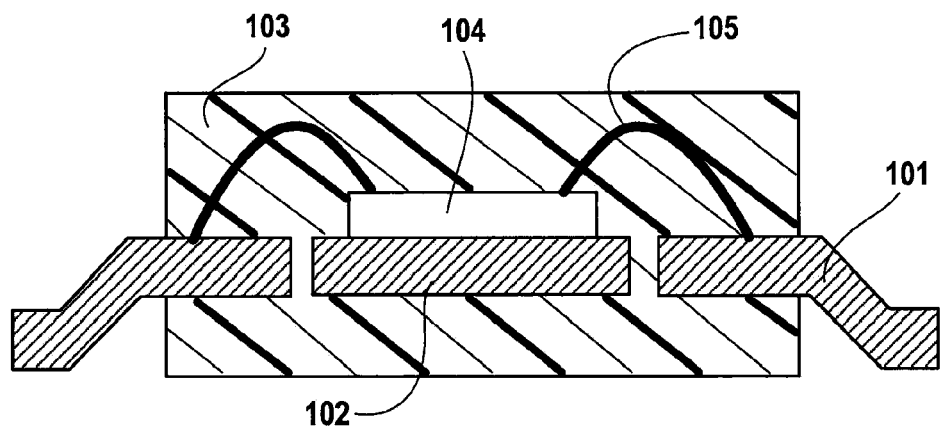

Referring to FIGS. 9A and 9B, next, the cover portion 15 is attached to each unit 32 to cover the opening of the casing 12. FIG. 9A is an enlarged view of the units 32, and FIG. 9B is a cross-sectional view taken along a line X-X' of FIG. 9A.

Specifically, the cover portion 15 is attached to the concave portion 25 of each unit 32 through the adhesive. The planar size of the concave portion 25 is larger than that of the cover portion 15, and the cover portion 15 is accommodated in the concave portion 25. Furthermore, the portion of the cover portion 15 with a certain thickness on the bottom side is accommodated in the concave portion 25, thus reinforcing the attachment thereof. The cover portion 15 is attached to the upper portion of the casing 12 through the adhesive.

Herein, the cover portions 15 divided into a predetermined size are placed on the concave portions 25 of the respective units 32. Accordingly, it is possible to minimize the effect on each unit 32 by warpage generated in the entire frame. Specifically, the side portion 12A and bottom portion 12B constituting the casing 12 are warped, in no small part, insteps including the aforementioned molding step, and the cover portion 15 is made of glass, which is brittle. If a large cover portion is placed so as to cover some of the units 32, therefore, deformation could be caused in the entire frame. Furthermore, when the large cover portion 15 is used, the cover portion could be damaged by the effect of the aforementioned warpage. Accordingly, the cover portion 15 cut into a desired size may be placed in each unit 32.

For the cover portion 15, as described above, it is possible to employ a material (for example, transparent glass) transparent to the light emitted or received by the semiconductor element 13.

After the attachment of the cover portions 15 is finished, the frame 31 is divided at dividing lines L1 indicated by chain lines into each circuit device. This division can be performed by a dividing method using dicing or laser. The circuit devices divided in this step are mounted on mother boards or within casings of sets by surface mounting using conductive adhesive such as soft solder.

What is claimed is:

1. A circuit device, comprising:
   a casing;
   a semiconductor element arranged in a bottom portion of the casing;
   a communication portion which is provided in a portion of the bottom portion corresponding to an arrangement area of the semiconductor element and which allows the inside of the casing to communicate with the outside, and
   a lead electrically connected to the semiconductor element and exposed to the outside of the casing,
   wherein an internal space of the casing is in direct communication with the outside of the casing via the communication portion.

2. The circuit device according to claim 1, wherein the semiconductor element is fixed to the bottom portion through a die attach sheet.

3. The circuit device according to claim 1, wherein the communication portion includes:
   a plurality of groove portions continuously provided to edges of the arrangement area; and
   a communication hole provided by penetrating the groove portions.

4. The circuit device according to claim 3, wherein the plurality of groove portions are provided to cross each other, and the communication hole is provided at a place where the groove portions cross each other.

5. The circuit device according to claim 3, wherein one groove portion is provided, and the communication hole is provided in the middle of the groove portion.

6. The circuit device according to claim 1, wherein the communication portion is formed to protrude from an area where the semiconductor element is placed.

7. The circuit device according to claim 1, wherein the casing encloses the internal space and the communication portion is a volume which enables the internal space to be in gas flow communication with the outside of the casing.

8. A circuit device, comprising:
   a casing which is composed of a bottom portion and a side portion and includes an opening in an upper portion;
   a semiconductor element which is fixed to the bottom portion and includes one of a light emitting portion and a light receiving portion on a surface thereof;
   leads buried in the bottom portion and arranged with one end close to the semiconductor element;
   a thin metal wire connecting the semiconductor element and one of the leads;
   a cover portion made of a material transparent to one of light emitted by the light emitting portion and light received by the light receiving portion, the cover portion covering the opening; and
   a communication portion which is provided in a portion of the bottom portion corresponding to an arrangement area of the semiconductor element and which allows the inside of the casing to communicate with the outside thereof,
   wherein an internal space of the casing is in direct communication with the outside of the casing via the communication portion.

9. The circuit device according to claim 8, wherein the semiconductor element is fixed to the bottom portion through a die attach sheet.

10. The circuit device according to claim 8, wherein the communication portion includes:
    groove portions continuously provided to edges of the arrangement area; and
    a communication hole penetrating the groove portions.

11. The circuit device according to claim 10, wherein the plurality of groove portions are provided to cross each other, and the communication hole is provided at a place where the groove portions cross each other.

12. The circuit device according to claim 10, wherein one groove portion is provided, and the communication hole is provided in the middle of the groove portion.

13. The circuit device according to claim 8, wherein the communication portion is formed to protrude from an area where the semiconductor element is placed.

14. A circuit device, comprising:

a casing enclosing an internal space and having a bottom portion;

a semiconductor element arranged in the a bottom portion of the casing;

a communication volume, which is provided in a portion of the bottom portion corresponding to an arrangement area of the semiconductor element and which enables the internal space to be in gas flow communication with an outside of the casing, and a lead electrically connected to the semiconductor element and exposed to the outside of the casing.

\* \* \* \* \*